United States Patent [19]
Dries et al.

[11] Patent Number: 5,783,854
[45] Date of Patent: Jul. 21, 1998

[54] THERMALLY ISOLATED INTEGRATED CIRCUIT

[75] Inventors: Michael F. Dries, Chanhassen; Roger L. Roisen, Minnetrista, both of Minn.

[73] Assignee: Honeywell Inc., Minneapolis, Minn.

[21] Appl. No.: 729,208

[22] Filed: Oct. 15, 1996

[51] Int. Cl.[6] ................................................. H01L 31/058
[52] U.S. Cl. ........................ 257/467; 257/468; 257/469; 257/470; 257/713; 257/717
[58] Field of Search .............................. 257/467, 469, 257/470, 468, 713, 717

[56] References Cited

U.S. PATENT DOCUMENTS

| | | |
|---|---|---|
| 3,769,562 | 10/1973 | Bean ................................. 317/235 R |
| 4,257,061 | 3/1981 | Chapel, Jr. et al. ...................... 357/69 |
| 5,360,987 | 11/1994 | Shibib ................................ 257/465 |
| 5,521,421 | 5/1996 | Furuhata ............................ 257/467 |
| 5,596,219 | 1/1997 | Hierold ............................. 257/467 |
| 5,600,174 | 2/1997 | Reay et al. ......................... 257/467 |

FOREIGN PATENT DOCUMENTS

WO 95/24737  9/1995  WIPO.

*Primary Examiner*—William Mintel
*Attorney, Agent, or Firm*—Gregory A. Bruns

[57] ABSTRACT

Thermally isolated circuit formed on a semiconductor on insulator structure includes a semiconductor surrounded by a semiconductor outer portion with an insulator therebetween. A cavity formed in the underlying semiconductor substrate opposite to the island provides thermal isolation.

13 Claims, 2 Drawing Sheets

THERMALLY ISOLATED INTEGRATED CIRCUIT

BACKGROUND OF THE INVENTION

The present invention relates to integrated circuit applications where there is a need to thermally isolate a portion of an integrated circuit from the remainder of the circuit and from ambient temperature variations.

Various methods of isolating portions of integrated circuits, especially for use in reference voltage designs, have been proposed. In some cases it was suggested that the sensitive portions of the circuits, e.g., the thermal sensors, be isolated by keeping them at a distance from the remaining circuitry. The problem is that Silicon is a very good conductor of heat.

Another method of isolation for a bulk CMOS process was suggested in an article entitled "A Micromachined Low-Power Temperature Regulated Bandgap Voltage Reference" by Reay, Klassen and Kovacs, 1995 IEEE Solid State Circuits Conference, Feb. 16, 1995, p. 166–167, whereby a portion of the silicon surrounding the sensor area was etched out. This, however, leaves a portion of the integrated chip suspended by a thin "cantilever" of metal and $SiO_2$. This makes the chip susceptible to damage from vibration and due to the limitations of the bulk silicon process does not allow high temperature operation, e.g. greater than 200° C.

A method of thermally isolating certain components used in temperature regulated voltage reference integrated circuits is required. In order to reduce the amount of temperature induced voltage drift, the sensing elements for a voltage regulator need to be kept free from large thermal excursions due to ambient temperature changes. This is especially true for high temperature electronics which may need to operate from −55° C. to +225° C. or higher.

There is a rapidly developing need for integrated circuits that can operate over a very wide temperature range, e.g. −55° C. to +300° C. Examples of applications include jet engine controls, automotive engine controls, down-hole oil drilling, logging and monitoring, aerospace and military. Thus, a need exists for an accurate reference voltage circuit, located on the same integrated circuit die, that will operate over a wide range of ambient temperatures.

One approach to limiting the thermal excursions is to heat the portion of the integrated circuit where the sensing elements are located and control the heat such that at cold ambient operating conditions more heat is added and for warm ambient operating conditions less, or no, heating is done. The heating must be done so that the remaining circuitry is not adversely affected. The result is that the sensing elements undergo a greatly reduced temperature excursion relative to ambient temperature.

Thus, a need exists for an integrated circuit structure that provides for heating a portion of an integrated circuit.

SUMMARY OF THE INVENTION

The present invention solves these and other needs by providing a thermally isolated integrated circuit which includes a semiconductor substrate, an insulative layer formed on the substrate, a semiconductor layer formed on the insulative layer, including an inner portion and an outer portion with a space between. Heating means and circuit means are formed on the inner portion and a cavity is formed in the substrate opposite the inner portion. The circuit means is maintained at a first temperature by the heating means for ambient temperatures below the first temperature and the cavity provides thermal isolation. In order to protect the integrated circuit during the etching of the cavity, a plurality of protective coatings are applied to the semiconductor layer.

DETAILED DESCRIPTION OF THE PRESENT INVENTION

Figure 1:
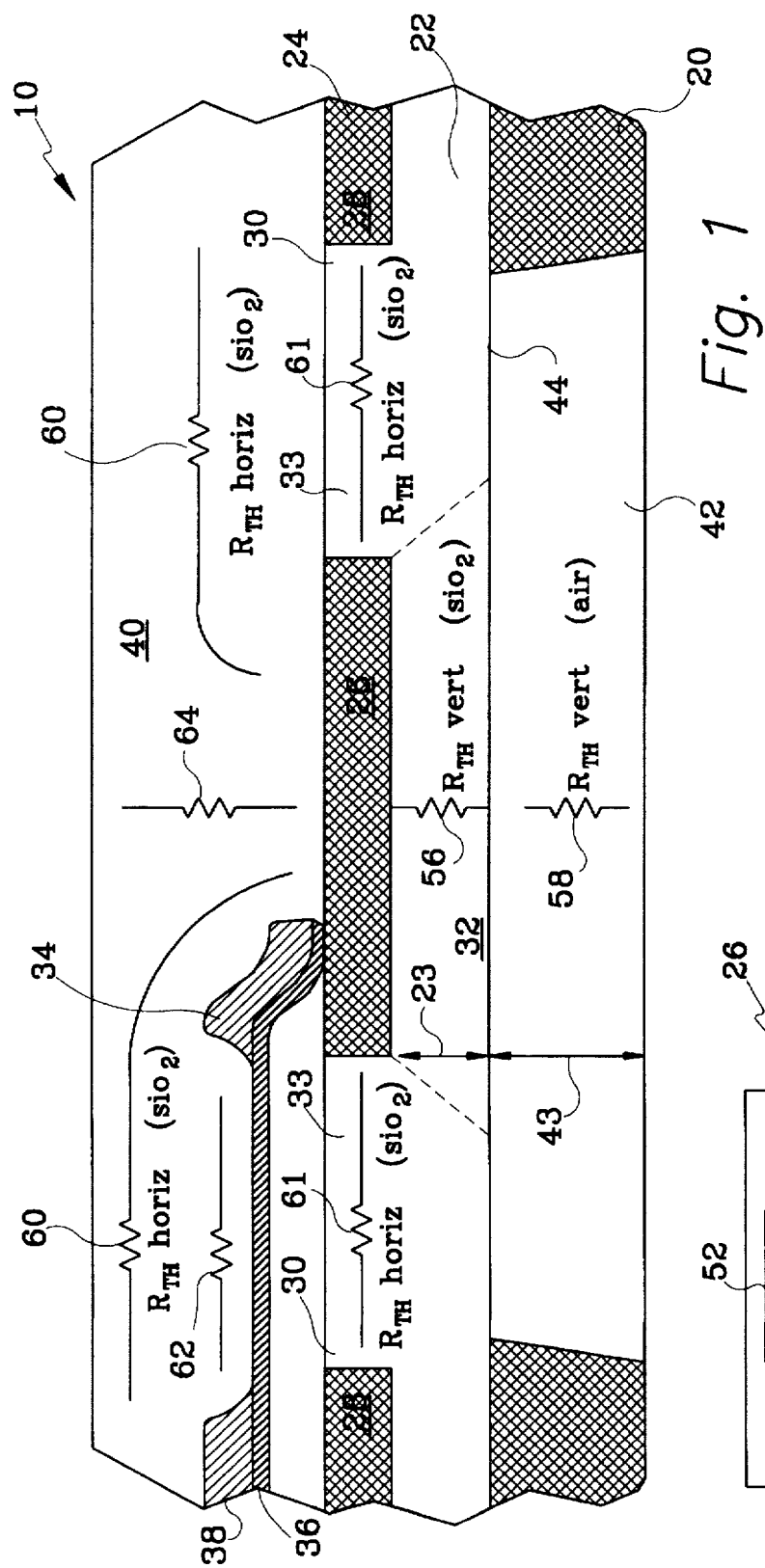
FIG. 1 is a partial elevation view of an integrated circuit device according to the principles of the present invention.

FIG. 1 shows a partial elevation view of a thermally isolated integrated circuit 10 according to the teachings of the present invention, with thermal resistance paths indicated by a resistor symbol. Device 10 includes a silicon substrate 20, a layer of silicon dioxide 22 and a layer of silicon 24. Layer 24 includes inner silicon portion or island 26, and outer or surrounding silicon portion 28. Silicon dioxide layer 22 has a thickness 23. Trenches or spaces 30 in silicon layer 24 are filled with silicon dioxide 33. Conductor 34 extends from a pad (not shown) on silicon island 26 to a connection (not shown) on inner silicon portion 28. Conductor 34 includes, for example, a first TiW layer 36 and a second AlCu layer 38 with a portion of AlCu layer 38 being removed to increase the thermal resistance. A passivating layer 40 of, for example, silicon dioxide, overlays silicon layer 24.

Cavity 42 having a depth 43 is formed in substrate 20 and extends to surface 44 of silicon dioxide layer 22.

Figure 1A:
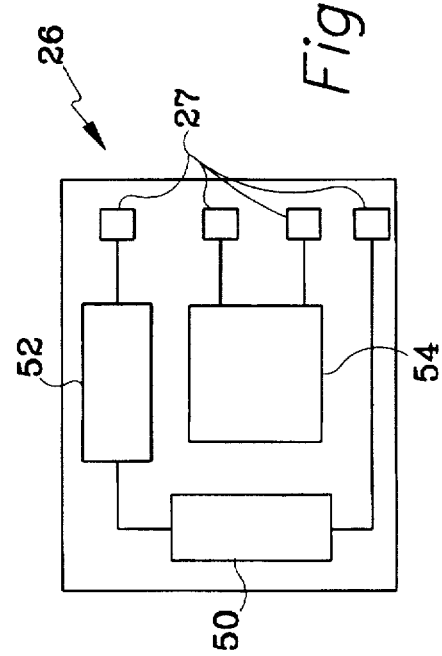
FIG. 1a is a plan view of a portion of the device of FIG. 1.

Device 10 as shown in FIG. 1a includes on silicon island 26 a heating means 50 and a control means 52 for the heating means. Voltage reference circuit 54 may then be located on silicon island 26 and maintained at a constant temperature by controlling the amount of heat dissipated in the heating means. Connections to heating means 50, control means 52 and voltage reference circuit 54 are made at connection pads 27 and extend to circuitry located on silicon portion 28.

As shown in FIG. 1, a number of thermal paths exist from silicon island 26. These include vertical $SiO_2$ path 56, vertical air path 58, horizontal $SiO_2$ paths 60 and 61, and vertical $SiO_2$ path 64. In addition, conductor 34 adds a parallel horizontal thermal path 62 as does any metal connection to silicon island 26.

A figure of merit for thermal isolation is the thermal resistance $R_{th}$ which is equal to $$\frac{t}{K \times l \times (w + 2t)}$$

where t is thickness, l is length of the path, w is width of the path and K is a thermal constant.

Approximate thermal constants are as follows:

$Ks_i$=1.1W/°C.–cm, $KSiO_2$=0.014W/°C.–cm, and Kair=0.0003W/°C.–cm.

Figure 2:
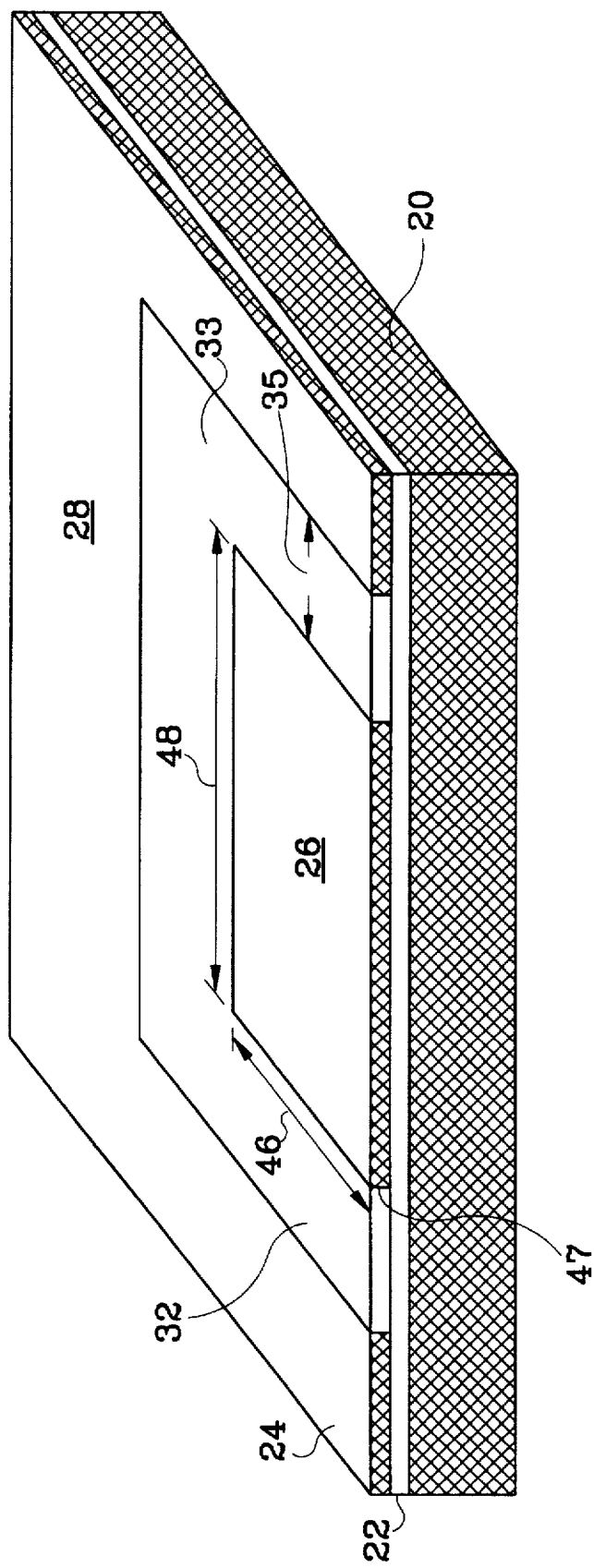
FIG. 2 is a partial perspective of one stage of the fabrication of the device of FIG. 1.

FIG. 2 shows a perspective view of one stage of fabrication of device 10 showing silicon substrate layer 20, silicon dioxide layer 22, and layer 24 of silicon, including island 26 and outer silicon portion 28. Silicon island 26 has a length 46, a width 48 and thickness 47. FIG. 2. shows a stage of fabrication prior to forming circuits on island 26 or on silicon portion 28. Completely trenched island of silicon 26 is somewhat thermally isolated from silicon portion 28 since the thermal resistivity of SiO$_2$ is 2 orders of magnitude better than silicon. Trench oxide 33 must have a width 35 that is sufficiently wide to provide a very high thermal resistance.

The horizontal thermal resistance of SiO$_2$ 46 in FIG. 2 can be made very large. For an island of 185 microns by 185 microns and with a trench width 35 of 4 microns, a thermal resistance of 9252° C./W was calculated. This, of course, can be increased by increasing the trench width 35. However, with continued reference to FIG. 2, there is a vertical thermal resistance that is much smaller.

Examples using some typical dimensions and calculating vertical thermal resistivity will illustrate certain advantages of the present invention.

EXAMPLE 1

Referring to FIG. 2, the first example is for a structure with no cavity in substrate 20. The assumptions for example 1 are as follows: There is no cavity 40; silicon island 26 is 185 microns on a side; the thickness of oxide layer 22 below silicon island 26 is 4000 Angstroms; thickness of silicon substrate 20 is 10 mils and the thickness of oxide layer 22 is much less than the width of trenches 30, making the vertical thermal resistance 56 from silicon island 26 the major consideration.

In an actual calculation of the total thermal resistance, each path must be accounted for and the paths are then summed up by a parallel add. In the example we will consider only the thermal resistance of the buried oxide 22. An approximate analysis can be done by assuming that the entire silicon substrate 20 is at the ambient temperature. For a silicon island measuring 185 micron by 185 micron and without cavity 40, the thermal resistivity is $$\frac{4 \times 10^{-5}}{1.4 \times 10^{-2} \times 1.85 \times 10^{-2}(1.85 \times 10^{-2} + 8 \times 10^{-5})}$$

or 8.31 C/W. To raise the temperature of silicon island 26 by 250° would require nearly 30 watts to be dissipated in the heater resistor. This is clearly an excessive amount.

EXAMPLE 2

By etching away a portion of silicon substrate 20, the vertical thermal resistance can be greatly increased. For this example, the vertical thermal resistance will be very high since it is the series resistance of silicon dioxide layer 22 and the air of cavity 40. Air is a relatively good thermal insulator (K=0.0003W/°C.–cm) and if cavity 42 is filled with air, a thermal resistance nearly 4 orders of magnitude greater can be achieved.

With an air filled cavity 42 and trench width 35 greater than 10 microns, it is easily possible to obtain a vertical thermal resistance greater than 10,000° C./W. This means that to raise the temperature of island 26 relative to portion 28 by 250° C. would only require 25 milliwatts to be dissipated by heating means 50. There are, of course, other parallel thermal resistances.

Subsequent intermetallic oxide 40, as well as electrical connections such as 34 from silicon island 26 to silicon portion 28 will add horizontal thermal paths. In FIG. 1, AlCu layer 38 is stripped back and only the TiW is used for a portion of the interconnection to increase thermal resistance.

The present invention is for use in conjunction with processes for fabricating high temperature electronics, that will function over the −55° C. to +250° C. range. After the high temperature electronics have been fabricated, an encapsulating layer or film is deposited on top of the wafer. This film includes several depositions of plasma oxide followed by plasma nitride. The encapsulating layer allows the wafer to be immersed in the silicon etchant for the length of time required to etch the cavities. It may be required to etch up to 25 mils of silicon to form cavity 40. Conventional processes use a metal shorting film followed by a film resistant to the etchant. The conventional process can not be used here because of the presence of active electronics and the formation of pinholes. The multiple film deposition of the present invention will prevent pinholes by not allowing the pinholes in each deposited layer to line up vertically and thus allow the etchant to reach the top surface of the wafer. A heated potassium hydroxide mixture is used for the etchant which allows one to precisely etch toward the silicon island and stop on buried oxide layer 22. After patterning and etching the encapsulating films, the topside electronics are available for wiring and bonding.

An alternate method of protecting the electronics during etching is to deposit a layer of TiW on both the front side and the back side of the wafer. A photoresist is applied to the back side and patterned for the cavity etch. A wax coating over the front side TiW can be used to protect it while a portion of the TiW on the back side is removed to form a mask for etching the cavity. The wax and the photo resist are then removed and the cavity is etched, stopping on silicon dioxide layer 32. The TiW is then removed by etching from the front side and the back side, and the front side is patterned and etched for metallization.

The layers of SiO$_2$ 40 above silicon island 26 while reducing the thermal resistance, do increase the mechanical strength of this region of the sensor. In addition, island 26 is supported on all sides, unlike the cantilever arrangement of some previous designs. Thermally isolated circuit 10 is therefore less susceptible to damage from shock and vibration. The jet engine testing, automotive engine testing and down-hole oil drilling environments require a sensor that can withstand high levels of shock and vibration.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

We claim:

1. A thermally isolated integrated circuit comprising:
   a semiconductor substrate;
   an insulative layer formed on said semiconductor substrate;
   a semiconductor layer formed on said insulative layer, said semiconductor layer including an inner portion and an outer portion with a space between said inner portion and said outer portion;
   circuit means formed on said inner portion;
   a cavity formed in said substrate opposite said inner portion; and
   means for heating formed on said inner portion whereby said inner portion is maintained at a first temperature for ambient temperatures below said first temperature.

2. Integrated circuit of claim 1 wherein said semiconductor substrate and said semiconductor layer are silicon, said insulative layer is an oxide of silicon, and said space contains an oxide of silicon.

3. Integrated circuit of claim 2 wherein said circuit means comprises voltage reference means.

4. Integrated circuit of claim 3 wherein said cavity is filled with a first material having a thermal resistivity greater than a thermal resistivity of silicon.

5. Integrated circuit of claim 4 wherein said first material is silicon dioxide.

6. Integrated circuit of claim 5 wherein said circuit means and said means for heating include means for connecting to circuit means formed on said outer portion and said means for connecting comprises a first layer of metal and a second layer of metal with a portion of said second layer removed to increase thermal resistivity.

7. An integrated circuit comprising:

a silicon substrate;

an oxide layer formed on said silicon substrate;

a silicon layer formed on said oxide layer, said silicon layer including an island and a remaining portion with an oxide filled space therebetween;

heating means formed on said island;

voltage reference means formed on said island;

circuit means formed on said remaining portion;

means for connecting said heating means and said voltage reference means to said circuit means; and a cavity formed in said silicon substrate to provide thermal isolation when said island means is maintained at a temperature above ambient by said heating means.

8. Integrated circuit of claim 7 wherein said cavity is filled with a first material having a thermal resistivity greater than a thermal resistivity of silicon.

9. Integrated circuit of claim 8 wherein said first material is silicon dioxide.

10. Integrated circuit of claim 7 wherein said means for connecting comprises a first layer of metal and a second layer of metal with a portion of said second layer removed to increase thermal resistivity.

11. A thermally isolated integrated circuit comprising:

a silicon on insulator substrate including an underlying silicon layer, a buried oxide layer and an overlying silicon layer;

said overlying silicon layer having an inner portion and an outer portion spaced from said inner portion;

circuit means formed on said inner portion;

cavity means formed in said underlying silicon layer; and heating means for maintaining said circuit means at a first temperature.

12. Integrated circuit of claim 11 wherein said circuit means comprises voltage reference means.

13. Integrated circuit of claim 12 wherein said circuit means and said means for heating include means for connecting to circuit means formed on said outer portion and said means for connecting comprises a first layer of metal and a second layer of metal with a portion of said second layer removed to increase thermal resistivity.

* * * * *